(12) United States Patent
Nakahara (10) Patent No.: US 8,116,051 B2
(45) Date of Patent: Feb. 14, 2012

(54) POWER SUPPLY CONTROL CIRCUIT (75) Inventor: Akihiro Nakahara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 576 days.

(21) Appl. No.: 12/328,103

(22) Filed: Dec. 4, 2008

(65) Prior Publication Data

US 2009/0146628 A1   Jun. 11, 2009

(30) Foreign Application Priority Data

Dec. 11, 2007   (JP) .................................. 2007-319451

(51) Int. Cl.
*H02H 3/00* (2006.01)
(52) U.S. Cl. ......................................................... 361/84
(58) Field of Classification Search .................... 361/84, 361/90
See application file for complete search history.

(56) References Cited

U.S. PATENT DOCUMENTS

| | | | | |
|---|---|---|---|---|
| 4,296,335 A * | 10/1981 | Simcoe | ........................ | 327/108 |
| 5,465,188 A * | 11/1995 | Pryor et al. | ...................... | 361/18 |
| 5,672,896 A * | 9/1997 | Lee et al. | ........................ | 257/360 |
| 6,392,463 B1 | 5/2002 | Kitagawa et al. | | |
| 6,804,094 B2 * | 10/2004 | Kampmeyer | .................... | 361/42 |
| 6,882,513 B2 * | 4/2005 | Laraia | ........................... | 361/91.1 |
| 7,283,343 B2 * | 10/2007 | Grose et al. | ........................ | 361/84 |
| 7,719,817 B2 * | 5/2010 | Newman, Jr. | .................. | 361/173 |
| 2006/0282703 A1 * | 12/2006 | Nam | ................................ | 714/14 |
| 2009/0147422 A1 * | 6/2009 | Nakahara | ........................ | 361/84 |
| 2011/0101935 A1 * | 5/2011 | Nakahara | ....................... | 323/276 |

FOREIGN PATENT DOCUMENTS

| | | |
|---|---|---|
| EP | 0 294 887 | 12/1988 |
| EP | 1 744 457 | 1/2007 |
| JP | 2004-173292 | 6/2004 |
| JP | 2007-19812 | 1/2007 |
| JP | 2007-28747 | 2/2007 |

OTHER PUBLICATIONS

European Patent Office issued an European Search Report dated Mar. 17, 2009, Application No. 08 02 1473.

* cited by examiner

*Primary Examiner* — Ronald W Leja
(74) *Attorney, Agent, or Firm* — Young & Thompson (57) ABSTRACT

An exemplary aspect of a power supply control circuit includes a reference voltage control circuit that applies a potential corresponding to a potential of a second power supply line to a reference voltage node connected to a control terminal of a first switch when a power supply voltage is applied in a forward direction between first and second power supply lines, and that applies a potential corresponding to a potential of a first power supply line to the reference voltage node when the power supply voltage is applied in the reverse direction between the first and second power supply lines.

16 Claims, 6 Drawing Sheets

PRIOR ART

Fig. 1

PRIOR ART

POWER SUPPLY CONTROL CIRCUIT

BACKGROUND

1. Field of the Invention

The present invention relates to a power supply control circuit. In particular, the present invention relates to a power supply control circuit having a power supply reverse connection protection function for protecting an output transistor against overpower when a power supply is reversely connected (hereinafter, referred to as "power supply reverse connection protection function"), and also having an overvoltage protection function for protecting the output transistor against overvoltage that may be applied from a power supply line or an output terminal when the power supply is normally connected (hereinafter, referred to as "overvoltage protection function").

2. Description of Related Art

Japanese Unexamined Patent Application No. 2007-019812 (hereinafter, referred to as "Patent Document 1"), for example, discloses a power supply control circuit having a power supply reverse connection protection function. The power supply control circuit disclosed in Patent Document 1 is described with reference to FIG. 1.

Figure 1:
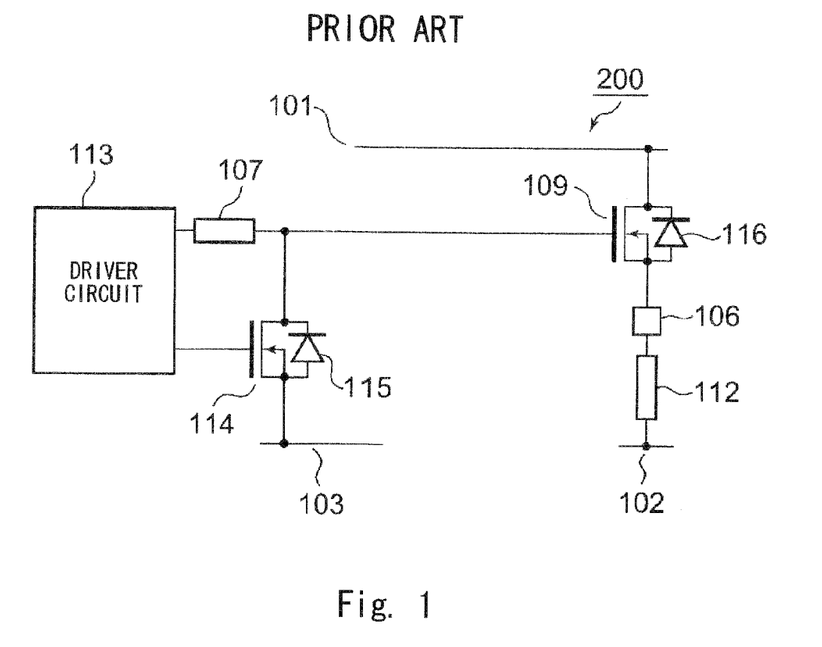
FIG. 1 is a conventional circuit diagram showing a power supply control circuit.

A power supply control circuit 200 includes an output transistor 109, a load 112, and a driver circuit 113. The output transistor 109 is connected between a power supply line 101 and an output terminal 106. The power supply line 101 is electrically connected to a positive terminal of a battery power supply. The load 112 is connected between the output terminal 106 and a power supply line 102. The driver circuit 113 controls a conductive/non-conductive state of the output transistor 109 through a gate resistor 107.

To deal with the case where a power supply is reversely connected, a transistor 114 is connected between a power supply line 103 and an output transistor 116. The power supply line 103 is electrically connected to a negative terminal of the battery power supply. Operations thereof are described in Patent Document 1. When the power supply is reversely connected, the power supply lines 101 and 103 are electrically connected with the negative terminal and the positive terminal of the battery power supply, respectively. An electric charge is applied to the output transistor 109 through a parasitic diode 115 of the transistor 114, with the result that the output transistor 109 is rendered conductive and protected.

Figure 2:
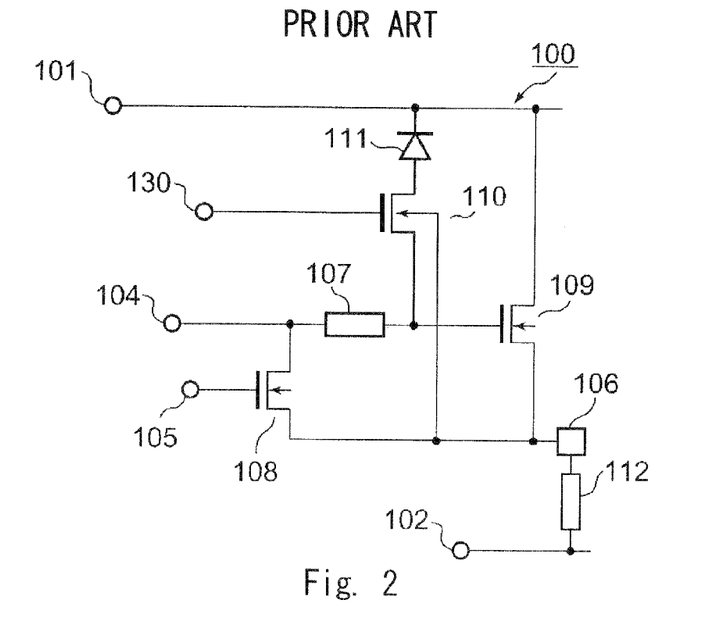
FIG. 2 is a conventional circuit diagram showing a power supply control circuit of another related art example.

Meanwhile, Japanese Unexamined Patent Application Publication No. 2007-028747 (hereinafter, referred to as "Patent Document 2"), for example, discloses a power supply control circuit having an overvoltage protection function. The structure of the power supply control circuit is shown in FIG. 2, and components identical with those shown in FIG. 1 are denoted by the same reference numerals. A power supply control circuit 100 additionally includes a gate charge discharging transistor 108, a switch transistor 110, and a dynamic clamp circuit 111.

The overvoltage protection function is executed by the switch transistor 110 and the dynamic clamp circuit 111, and is obtained by applying a ground potential 130 to a gate of the switch transistor 110 as a reference voltage. Note that the ground potential 130 is electrically connected with the negative terminal of the battery power supply. Operations thereof are described in detail in Patent Document 2, so a description thereof is herein omitted.

Note that the power supply line 102 serving as a second power supply connected to one end of the load 112 as shown in FIGS. 1 and 2 is connected to the negative terminal of the battery power supply.

In view of the above, there is a demand for a circuit having both the overvoltage protection function as shown in FIG. 1 and the power supply reverse connection protection function as shown in FIG. 2. In this case, the switch transistor 110 and the clamp circuit 111 may be provided, as shown in FIG. 2, between a gate of the transistor 109 shown in FIG. 1 and the power supply line 10. The present inventor has found that the structure, however, has a problem in that the protection function is inhibited in the state where the power supply is reversely connected.

In other words, the reference voltage applied to the gate of the switch transistor 110 is connected with a ground voltage during normal operation. For this reason, an electrical path is generally formed between the reference voltage applied to the switch transistor 110, and the power supply line 103. Accordingly, even in the case where the power supply is reversely connected, once the electrical path is activated, the power supply line 103 is set at a potential higher than that of the power supply line 101. Thus, the switch transistor 110 is rendered conductive and the diode 111 is biased in a forward direction, so the electric charge supplied to the gate of the output transistor 109 through the parasitic diode 115 of the transistor 114 is drawn into the switch transistor 110 and the diode 111. As a result, the output transistor 109 is not rendered conductive.

SUMMARY

The inventor has found a problem the output transistor is not rendered conductive as explained above.

A first exemplary aspect of an embodiment of the present invention is a power supply control circuit, including: a first and second power supply lines, a power supply voltage being applied between the first and second power supply lines; an output transistor coupled between the first power supply line and an output terminal; a first switch coupling the first power supply line with a control terminal of the output transistor when a counter electromotive voltage from a load, which is connected to the output terminal, is applied to the output terminal; a switching element coupling the second power supply line with the control terminal of the output transistor when the power supply voltage is applied in a reverse direction between the first and second power supply lines; and a reference voltage control circuit that applies a potential corresponding to a potential of the second power supply line to a reference voltage node coupled to a control terminal of the first switch when the power supply voltage is applied in a forward direction between the first and second power supply lines, and that applies a potential corresponding to a potential of the first power supply line to the reference voltage node when the power supply voltage is applied in the reverse direction between the first and second power supply lines.

Thus, according to the present invention, when the power supply voltage is reversely connected, the potential at the control terminal of the switch transistor is set to be substantially equal to that of the first power supply line by the reference voltage control circuit, and thus the switch transistor is rendered non-conductive. As a result, the electric charge supplied through the switching element is prevented being extracted by a parasitic transistor of the switch transistor, thereby making it possible to render the output transistor conductive.

Hence, the output transistor can be protected during both the normal connection and the reverse connection of the power supply.

Note that, when the output transistor and the switch transistor are formed into an integrated circuit on a single semiconductor substrate, it is desirable that the switch transistor include two transistors which are connected in series with each other, and each of which has a substrate terminal connected to a node between the transistors. As a result, a parasitic transistor effect is reliably prevented, and a desired operation can be executed.

A second exemplary aspect of an embodiment of the present invention is a power supply control circuit, including: an output transistor coupled between a first power supply line and an output terminal; a load coupled to the output terminal; a gate charge discharging switch coupled between a control terminal of the output transistor and the output terminal; a power supply reverse connection protection circuit that supplies an electric charge from a second power supply line to the control terminal of the output transistor when a power supply is reversely connected; and an overvoltage protection circuit, the overvoltage protection circuit comprises: a dynamic clamp circuit that limits a voltage difference between the first power supply line and the output terminal to a predetermined voltage value; and a first switch coupled in series between the dynamic clamp circuit and the control terminal of the output transistor, and to be conductive or non-conductive state based on a result of comparison between a reference voltage and a voltage at the output terminal, the reference voltage being set to a voltage corresponding to a voltage of the second power supply line when a power supply is normally connected and being set to a voltage corresponding to a voltage of the first power supply line when the power supply is reversely connected.

A third exemplary aspect of an embodiment of the present invention is a power supply control circuit, including: first and second power supply lines, a power supply voltage being applied between the first power supply line and the second power supply line; an output transistor connected between the first power supply line and an output terminal; a first switch that electrically connects the first power supply line with a control terminal of the output transistor when a counter electromotive voltage from a load, which is connected to the output terminal, is applied to the output terminal; a switching element that electrically connects the second power supply line and the control terminal of the output transistor to each other when the power supply voltage is applied in a reverse direction between the first and second power supply lines; and a control circuit that applies a potential corresponding to a potential of the second power supply line to a control terminal of the first switch when the power supply voltage is applied in a forward direction between the first and second power supply lines, and that applies a potential corresponding to a potential of the first power supply line to the control terminal of the first switch when the power supply voltage is applied in the reverse direction between the first and second power supply lines.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments to which the present invention is applied will be described in detail with reference to the drawings. The same components are denoted by the same reference symbols throughout the drawings, and a redundant description thereof is omitted as appropriate for clarification of the explanation.

Exemplary embodiments of the present invention will be described hereinafter in detail with reference to the attached drawings.

Figure 3:
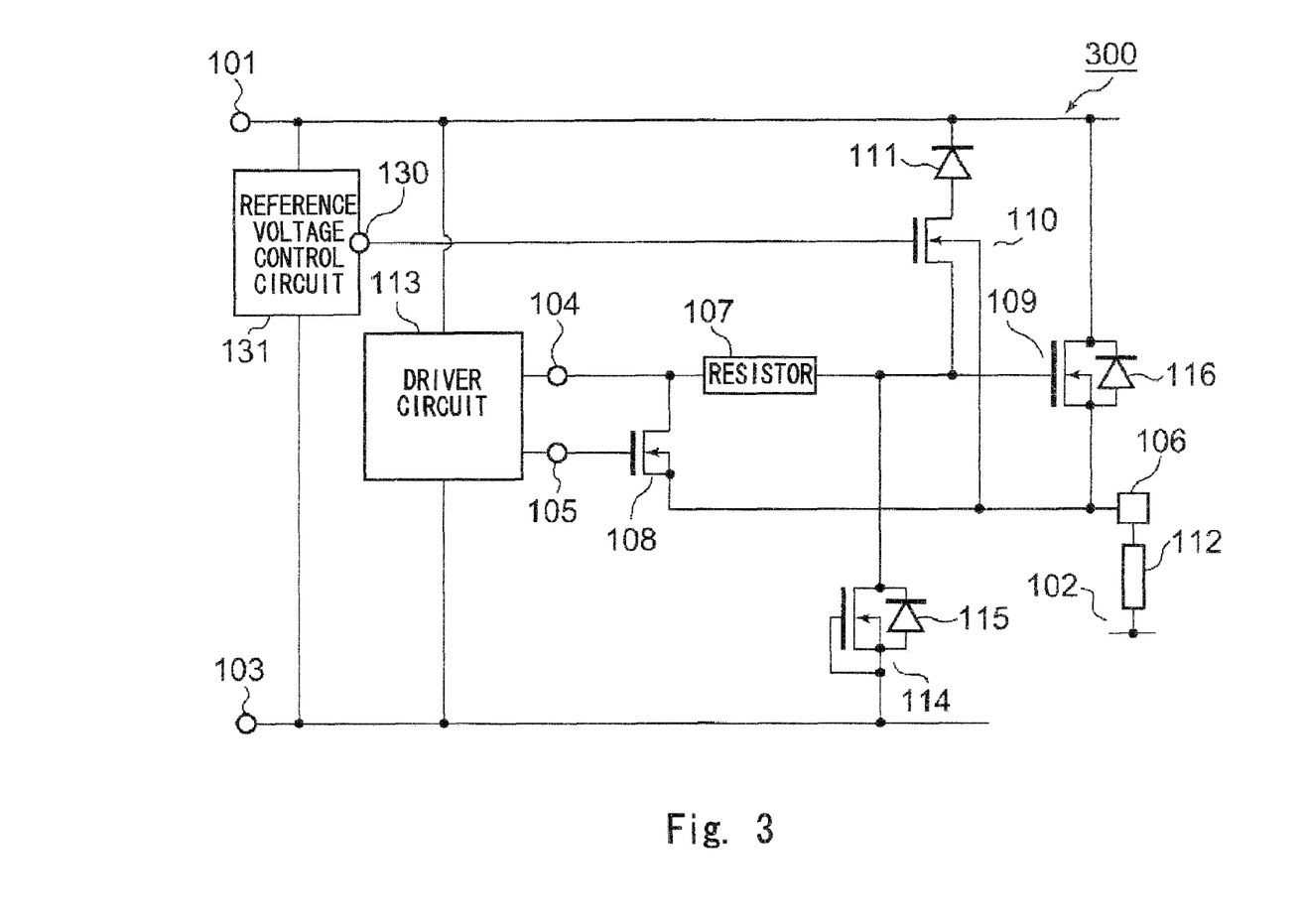
FIG. 3 is a circuit diagram showing a power supply control circuit according to a first exemplary embodiment of the present invention.

FIG. 3 shows a power supply control circuit 300 according to a first exemplary embodiment of the present invention. The power supply control circuit 300 includes a gate charge discharging transistor (gate charge discharging switch) 108, a gate resistor 107, an output transistor 109, a switch transistor (first switch) 110, a dynamic clamp circuit 111, a driver circuit 113, a switch transistor (switching element) 114, a reference voltage control circuit (control circuit) 131, and a load 112. Note that the gate resistor 107 may be omitted. The switch transistor 114 is an N-type MOS (Metal Oxide Semiconductor) transistor, and functions as a power supply reverse connection protection switch (power supply reverse connection protection circuit). The gate charge discharging transistor (gate charge discharging circuit) 108 is also referred to simply as "transistor 108". As will be apparent from the following description, the switch transistor 110 and the dynamic clamp circuit 111 form an overvoltage protection circuit.

The output transistor 109 is a so-called high-side N-channel MOS transistor. A first terminal (for example, drain) of the output transistor 109 is connected to a first power supply Line (for example, positive terminal of battery power supply) 101. A second terminal (for example, source) of the output transistor 109 is electrically connected to a second power supply line (for example, negative terminal of battery power supply being set at ground potential) 102 through the load 112.

A node between the output transistor 109 and the load 112 serves as an output terminal 106. A control terminal (for example, gate) of the output transistor 109 is connected to one end of the gate resistor 107. The other end of the gate resistor 107 receives a first control signal 104 from the driver circuit 113. The gate charge discharging transistor 108 is coupled between the other end of the gate resistor 107 and the output terminal 106.

According to an exemplary embodiment of the present invention, the gate charge discharging transistor 108 is formed of an N-channel MOS transistor. A drain of the transistor 108 is connected to the other end of the gate resistor 107, and a source of the transistor 108 is connected to the output terminal 106. A gate of the transistor 108 is supplied with a second control signal 105 from the driver circuit 113.

The control terminal (gate) of the output transistor 109 is connected to a drain of the transistor 114. The source and the gate of the transistor 114 are connected to a power supply line 103. The power supply line 103 is electrically connected to the negative terminal of the battery power supply. Incidentally, the power supply line 102 and the power supply line 103 are frequently connected to different nodes in a total system to each other. Thereby voltage difference of about 2V may occur between the power supply line 102 and the power supply line 103.

The output transistor 109 includes a parasitic diode 116. The parasitic diode 116 has an anode connected to the output terminal 106, and a cathode connected to the first power supply line 101. The transistor 114 includes a parasitic diode 115. The parasitic diode 115 has an anode connected to the power supply line 103, and a cathode connected to the control terminal of the output transistor 109. The driver circuit 113 is connected between the power supply lines 101 and 103, and operates with a voltage applied between the power supply lines 101 and 103 as a power supply.

To realize an overvoltage protection function, the switch transistor 110 and the dynamic clamp circuit 111 are coupled in series with each other between the gate of the output transistor 109 and the power supply line 101. According to an exemplary embodiment of the present invention, the switch transistor 110 is formed of an N-channel MOS transistor, and the dynamic clamp circuit 111 is formed of a single Zener diode.

The switch transistor 110 has a source connected to the gate of the output transistor 109, a drain connected to an anode of the dynamic clamp circuit 111, a control terminal (for example, gate) connected to a reference voltage node 130, and a substrate terminal (back gate) connected to the output terminal 106. A cathode of the dynamic clamp circuit 111 is connected to the power supply line 101.

The switch transistor 110 compares a potential at the reference voltage node 130 with a potential at the gate (gate voltage) of the output MOS transistor 109. Then, when a difference between two potentials is equal to or larger than a threshold of the MOS transistor serving as the switch transistor 110, the switch transistor 110 is rendered conductive.

The dynamic clamp circuit 111 is a circuit that limits a voltage difference between the anode and the cathode to a predetermined voltage value (for example, dynamic clamp voltage) or smaller when the voltage difference between the anode and the cathode is equal to or larger than a breakdown voltage of the diode.

The load 112 is an inductive load having an inductance component, such as a solenoid, or an inductance component of a wire harness connected to the output terminal.

The reference voltage node 130 is supplied with a reference voltage from the reference voltage control circuit 131. The reference voltage is set to be substantially equal to a voltage of the power supply line 103, when the power supply is normally connected (when the positive terminal and the negative terminal of the battery power supply are electrically connected to the power supply lines 101 and 103, respectively). On the other hand, when the power supply is reversely connected (when the positive terminal and the negative terminal of the battery power supply are electrically connected to the power supply lines 103 and 101, respectively), the control circuit 131 supplies a voltage substantially equal to that of the power supply line 101 to the node 130.

Figure 4:
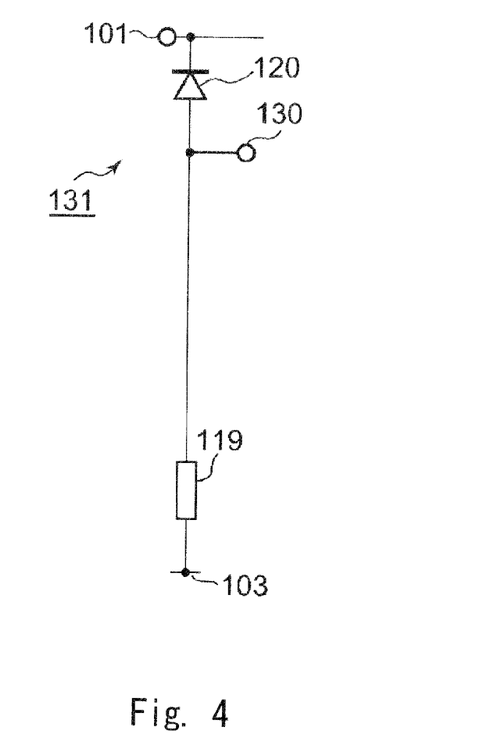
FIG. 4 is a circuit diagram showing an example of a reference voltage control circuit shown in FIG. 3.

Referring to FIG. 4, the reference voltage control circuit 131 includes a diode 120 and a resistor 119 which are connected in series with each other between the power supply lines 101 and 103. A node between the diode 120 and the resistor 119 is described as the reference voltage node 130. Thus, when the power supply is normally connected, the diode 120 is rendered non-conductive, with the result that a potential substantially equal to that of the power supply line 103 is applied to the gate of the switch transistor 110 through the reference voltage node 130. On the other hand, when the power supply is reversely connected, the diode 120 is biased in the forward direction. Accordingly, a potential substantially equal to that of the power supply line 101 (effectively, voltage increased by an amount corresponding to a forward voltage drop of the diode 120 from the potential of the power supply line 101) is supplied to the reference voltage node 130.

Note that the structure and operations of the drive circuit 113 shown in FIG. 3 are well known to those skilled in the art, so a description thereof is omitted.

Next, operations of the power supply control circuit 300 are described in detail. In this case, the operations are classified into two types, that is, an operation performed when the power supply is normally connected, and an operation performed when the power supply is reversely connected. Further, the operation performed when the power supply is normally connected includes the following modes. That is, a conductive mode, a negative voltage surge mode, and a dump surge mode. In the conductive mode, the output transistor 109 is rendered conductive, and power is supplied to the load 112 through the output terminal 106. In the negative voltage surge mode, a negative voltage surge occurs to the output terminal 106 from the load 112 as a counter electromotive voltage, when the output transistor 109 is rendered non-conductive. In the dump surge mode, a positive voltage surge (dump surge) occurs in the battery power supply line 101 by a battery terminal being disconnected while generating electricity for an alternator. The operations of the power supply control circuit 300 are described in each of the three modes.

First, in the conductive mode, when the first control signal 104 becomes a high level, the output transistor 109 is rendered conductive. The high-level first control signal 104 renders the output transistor 109 conductive with a low channel resistance. Thus, the high level signal of the first control signal 104 is, for example, a voltage obtained by boosting the battery power supply (voltage between power supply lines 101 and 103). Accordingly, power is supplied to the load 112 through the output terminal 106. In this case, a low-level potential (for example, ground potential) of the second control signal 105 having a phase opposite to that of the first control signal 104 is applied to the gate of the gate charge discharging transistor 108. Then, the gate charge discharging transistor 108 is rendered non-conductive.

When the power supply is normally connected, the reference voltage node 130 is set at a potential substantially equal to the ground potential (low level). The gate voltage of the output transistor 109 is set at high level (bootstrap potential higher than a potential level of the power supply line 101). Thus, the switch transistor (first switch) 110 is rendered non-conductive, and the dynamic clamp circuit 111 remains deactivated.

Next, the operation under the negative voltage surge is described. The negative voltage surge occurs on turn-off, when the output transistor 109 is rendered non-conductive In this case, the first control signal 104 is set at low level (ground potential), and the second control signal 105 is set at high level (at least a potential level of power supply line 101). Note that the second control signal 105 may be set at the bootstrap potential obtained by boosting the potential of the power supply line 101, depending on the circuit type.

Since the second control signal 105 is set at high level, the transistor 108 is rendered conductive. A gate charge of the output transistor 109 is discharged through the gate resistor 107 and the gate charge discharging transistor 108. As a result, the output transistor 109 is rendered non-conductive. In response to the non-conduction of the output transistor 109, an inductor component of the load 112 causes the negative voltage surge.

When the negative voltage is generated, a voltage at the output terminal 106 drops. Further, since the transistor 108 is conductive, the gate voltage of the output transistor 109 drops as the voltage at the output terminal 106 drops.

When a potential difference between the voltage at the reference voltage node 130 (that is, ground potential), which is equal to a gate voltage of the switch transistor 110, and the gate voltage of the output transistor 109 exceeds the threshold of the switch transistor 110 as the voltage at the output terminal 106 drops, the switch transistor 110 is rendered conductive. After that, when the gate voltage of the output transistor 109 drops due to the voltage drop of the output terminal 106 and when a potential difference between both terminals of the dynamic clamp circuit 111 becomes equal to or larger than the breakdown voltage of the dynamic clamp circuit, a dynamic clamp voltage is generated at both terminals of the dynamic clamp circuit 111. As a result, the output transistor 109 is rendered conductive. Thus, a voltage between the drain and the gate of the output transistor 109 is limited by the dynamic clamp voltage. Further, a voltage between the drain and the source of the output transistor 109 is limited by a value of a voltage obtained by adding the dynamic clamp voltage and a threshold voltage of the output transistor 109.

In the negative voltage surge mode, a voltage at the control terminal of the output transistor 109 is lower than that of the power supply line 103, which is equal to a potential on the source side of the transistor 114. Accordingly, a current flows from the power supply line 103 to the control terminal of the output transistor 109 through the parasitic diode 115. In this case, when the impedance of the gate charge discharging transistor 108 is sufficiently small, the voltage at the output terminal 106 can be lowered to a sufficiently large negative voltage without being affected by the switch transistor 114.

Next, the operation under the dump surge mode is described. When a dump surge is applied to the power supply line 101, the voltage thereof increases. In this case, the gate voltage of the switch transistor 110 is equal to the ground potential. The voltage at each of the gate of the output transistor 109 and the output terminal 106 is equal to or higher than the ground voltage. As a result, the switch transistor 110 is rendered non-conductive. In other words, the gate of the output transistor 109 and the battery power supply line 101 are electrically disconnected from each other. Thus, the gate of the output transistor 109 is free from the influence of a fluctuation in voltage of the battery power supply 101, and the output transistor 109 is rendered non-conductive.

The dump surge voltage is applied between the source and the drain of the output transistor 109 that is rendered non-conductive. In this case, a withstand voltage between the drain and the gate of the output transistor 109, and a withstand voltage between the drain and the source thereof are generally set to be higher than the dump surge voltage. Accordingly, the output transistor 109 is prevented from being destroyed due to the dump surge.

Next, a description is given to the operation when the power supply is reversely connected. Consideration is given to the case where the polarity of a battery power supply VB is reversely connected due to an error caused by an operator. Specifically, consideration is given to the case where the positive terminal of the battery power supply is electrically connected to each of the power supply lines 102 and 103 and the negative terminal of the battery power supply is electrically connected to the power supply line 101. In this case, assuming that the second power supply line 102 and the third power supply line 103 are set at the ground potential, the first power supply line 101 is set at a −VB potential.

In this situation, though the gate and the source of the switch transistor 114 are connected in common, the parasitic diode 115 is rendered conductive, thereby forming an electrical path between the power supply line 103 and the gate of the output transistor 109.

Meanwhile, the reference voltage control circuit 131 (see FIG. 4) sets the potential at the reference voltage node 130 to be substantially equal to the potential of the power supply line 101 when the power supply is reversely connected. Accordingly, the switch transistor 110 and the clamp circuit 111 are reversely biased and deactivated.

In this manner, when the power supply is reversely connected, the output transistor 109 is rendered conductive, and a current flows in a direction opposite to that at the time of a normal connection, that is, flows from the source to the drain of the output transistor 109. The magnitude of the current obtained in this case is substantially the same as that of a load current obtained during normal operation, and an on-resistance of the output transistor 109 is substantially equal to that obtained at the time of normal operation. Accordingly, a calorific value of the output transistor 109 is equal to that obtained during the normal operation (when battery power supply VB is normally connected).

As described above, the power supply control circuit 300 according to an exemplary embodiment of the present invention is capable of protecting the output transistor 109 against the overvoltage that may be applied to the power supply line 101, the counter electromotive voltage generated by the load, and against the reverse connection of the power supply. Note that the switch transistor 114 may be replaced with a diode having an anode connected to the side of the power supply line 103.

Figure 5:
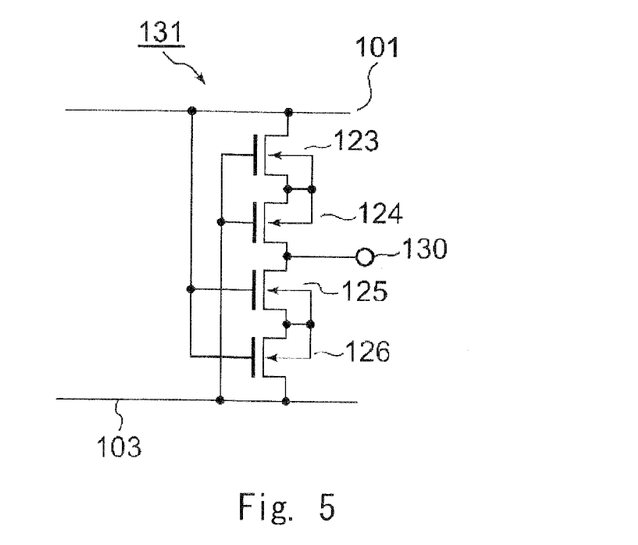
FIG. 5 is a circuit diagram showing another example of the reference voltage control circuit shown in FIG. 3.

FIG. 5 shows another example of the reference voltage control circuit 131 shown in FIG. 3. The reference voltage control circuit 131 includes four N-channel MOS transistors 123 to 126 which are connected as shown in FIG. 5.

When the power supply is normally connected, the transistors 123 and 124 are rendered non-conductive, and the transistors 125 and 126 are rendered conductive. Then, the voltage at the reference voltage node 130 becomes substantially equal to the voltage of the power supply line 103.

When the power supply is reversely connected, the transistors 123 and 124 are rendered conductive, and the transistors 125 and 126 are rendered non-conductive. Then, the voltage at the reference voltage node 130 becomes substantially equal to the voltage of the power supply line 101.

In this case, assuming that the power supply control circuit 300 shown in FIG. 3 is formed into an integrated circuit, the output transistor 109 preferably has a so-called vertical MOS structure because the output transistor requires high power. For this reason, an N-type conductive layer serving as a drain is usually used for a substrate of another transistor.

Figure 6:
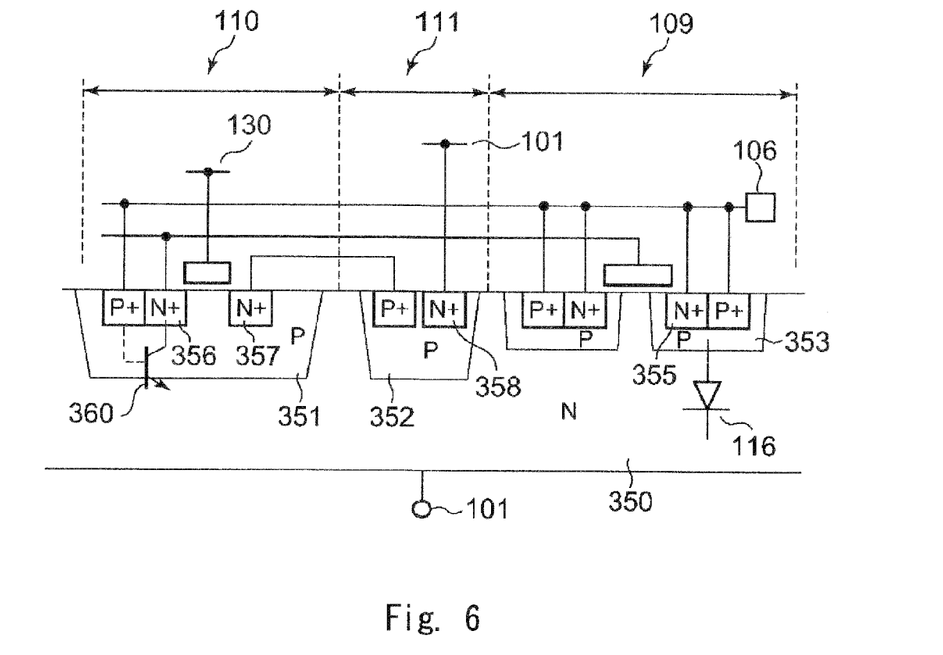
FIG. 6 is a schematic cross-sectional view showing a case where an output transistor and a clamp circuit, which are shown in FIG. 3, are formed into an integrated circuit.

FIG. 6 shows a schematic cross-sectional view showing the structure in which the output transistor 109, the switch transistor 110, and the clamp diode of the dynamic clamp circuit 111 are formed into an integrated circuit.

The output transistor 109 includes an N-type semiconductor substrate 350 serving as the drain, a P-well region 353 forming a channel region, and a source region 355. To form the switch transistor 110 and the dynamic clamp circuit 111 like in the semiconductor substrate 350 connected to the power supply line 101, P-well regions 351 and 352 are selectively formed.

In the well region 351, a source region 356 and a drain region 357 of the switch transistor 110 are formed. The source region 356 is connected via wiring to the gate of the output transistor 109. The drain region 357 is connected to the anode region (P-well region) 352 of the dynamic clamp circuit (clamp diode) 111. The P-well region 351 serving as the substrate terminal of the switch transistor 110 is connected to the output terminal 106 through a high-concentration P+ region.

The N-type semiconductor substrate 350 also functions as a cathode region of the dynamic clamp circuit 111. An N-type region 358 is formed in the P-well region 352 and is connected to the power supply line 101, thereby forming the cathode region in the N-type semiconductor substrate 350.

The problem is that a parasitic NPN bipolar transistor 360 is formed in the switch transistor 110. The parasitic transistor 360 is generated as a result of connection of the substrate terminal (P-well region 351) of the switch transistor 110 to the output terminal 106. The parasitic transistor 360 includes the P-well region 351 serving as a base, the N-type source region which is connected to the gate of the transistor 106 and serves as an emitter, and the N-type semiconductor substrate 350 serving as a collector.

When the power supply is reversely connected, the gate of the switch transistor 110 is set at a potential substantially equal to the potential of the power supply line 101 by the reference voltage control circuit 131 (see FIG. 3). In this case, since the potential at the output terminal 106 increases through the load 112, the base and the emitter of the parasitic transistor 360 are biased in a forward direction and rendered conductive. As a result, the electric charge flowing through the switch transistor 114, which is provided to implement the power supply reverse connection protection function, is extracted on the side of the power supply line 101 by the parasitic transistor 360. Thus, the output transistor 109 is not rendered conductive.

Figure 7:
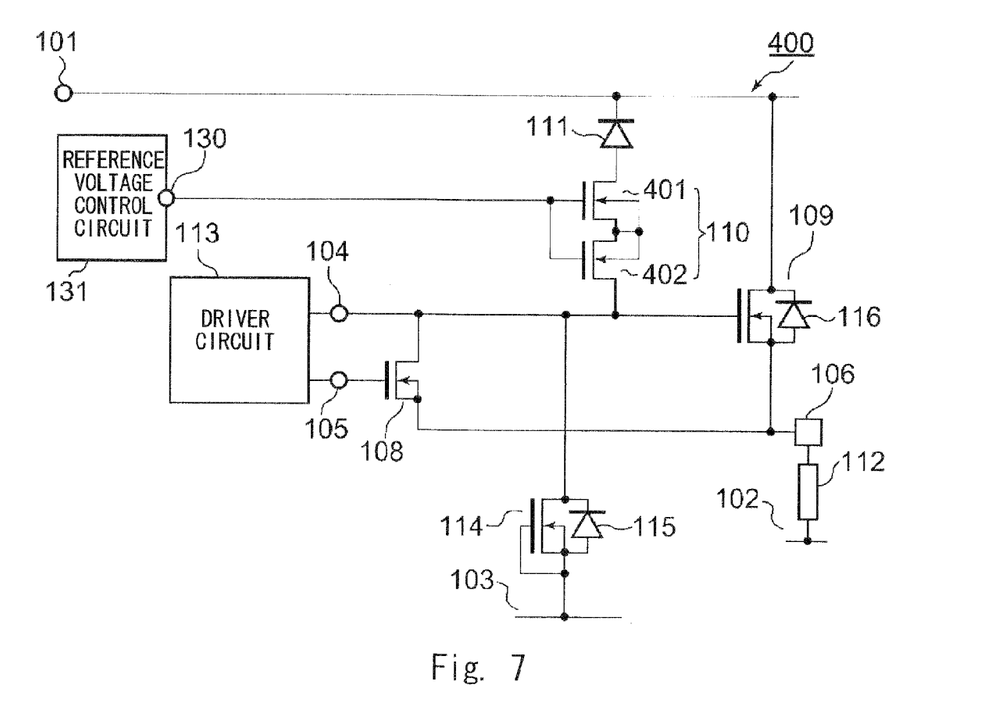
FIG. 7 is a circuit diagram showing a power supply control circuit according to a second exemplary embodiment of the present invention.

Referring to FIG. 7, a power supply control circuit 400 according to a second exemplary embodiment of the present invention includes the switch transistor 110 that is formed of two N-channel MOS transistors 401 and 402. Sources of the transistors 401 and 402 are connected in common, and substrate terminals (back gates) of the transistors 401 and 402 are also connected in common. A drain of the transistor 401 and a drain of the transistor 402 are connected to the dynamic clamp circuit 111 and the gate of the output transistor 109, respectively. The other components are the same as those shown in FIG. 3, so a redundant explanation thereof is omitted.

In this structure, the substrate terminals of the switch transistors 401 and 402 are electrically disconnected from the output terminal 106. In the structure shown in FIG. 7, the parasitic bipolar transistor 360 as shown in FIG. 6 is not formed. When the power supply is reversely connected, the non-conductivity of the switch transistor 110 (401 and 402) is secured, thereby making it possible to render the output transistor 109 conductive as the electric charge is supplied from the power supply line 103 through the switch transistor 114.

Note that, in a negative voltage surge mode during the normal connection of the power supply, the MOS transistor has a bidirectional characteristic, and thus the region of the transistor 402 disposed on the side of the gate of the output transistor 109 functions as a source. Thus the switch transistor 110 (401 and 402) which is rendered conductive by the counter electromotive voltage from the load 112 renders the output transistor 109 conductive and clamps the voltage between the drain and the source of the output transistor 109 to a predetermined value.

Further, referring to FIG. 7, elements other than the load 112 can be formed into an integrated circuit on a single semiconductor substrate. In this case, the semiconductor substrate itself may function as the drain region of the output transistor.

Referring to FIGS. 3 and 7, an impedance of the gate charge discharging transistor 108 is set to be sufficiently small so as to deal with a problem arising during the negative voltage surge mode, that is, a problem of the supply of the electric charge to the control terminal of the output transistor 109 through the parasitic diode 115. However, it is preferable to reliably block the transistor 114 and the parasitic diode 115 from the viewpoint of circuit design and prevention against malfunction.

Figure 8:
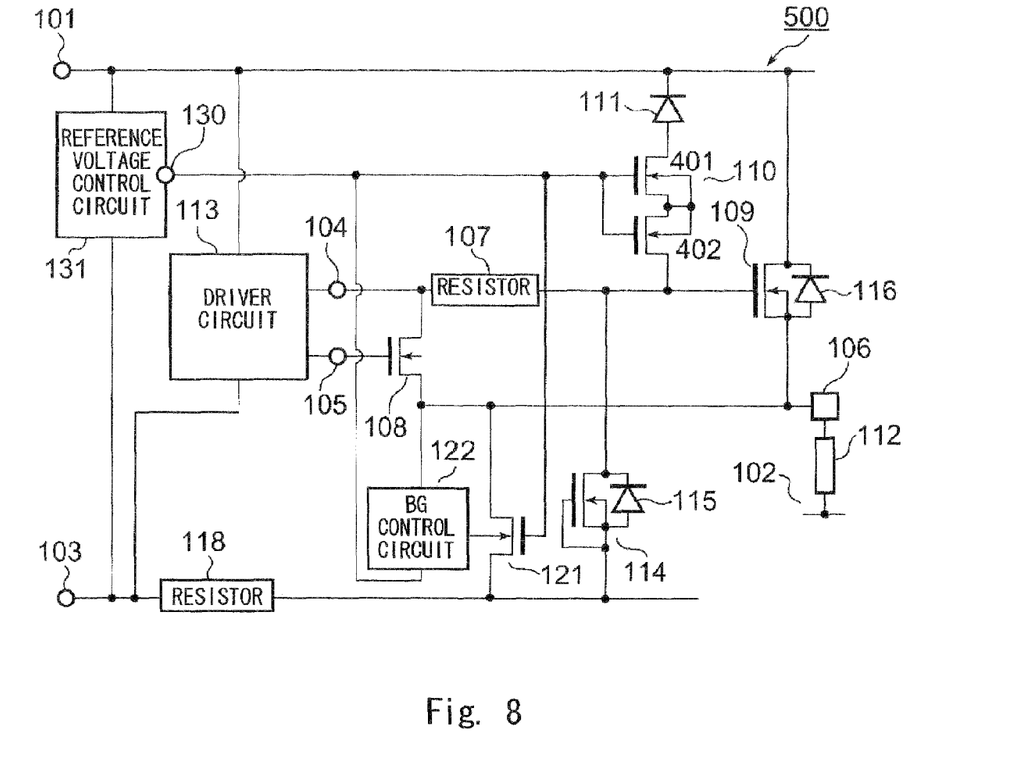
FIG. 8 is a circuit diagram showing a power supply control circuit according to a third exemplary embodiment of the present invention.

FIG. 8 shows the structure of a power supply control circuit according to a third exemplary embodiment of the present invention, which is provided so as to deal with the problem. Components identical with those shown in FIG. 7 are denoted by the same reference numerals, and a description thereof is omitted.

A power supply control circuit 500 according to an exemplary embodiment of the present invention additionally includes a switch transistor (second switch) 121, a back gate (BG) control circuit (substrate terminal control circuit) 122, and resistor 118. The BG control circuit 122 controls a potential at a substrate terminal (back gate) of the switch transistor 121. One end of the resistor 118 is connected to the power supply line 103. The switch transistor 121 is coupled between the other end of the resistor 118 and the output terminal 106. A gate of the switch transistor 121 is connected to the reference voltage node 130. The transistor 114 is coupled between the other end of the resistor 118 and the gate of the output transistor 109. The BG control circuit 122 is connected between the output terminal 106 and the reference voltage node 130.

Figure 9:
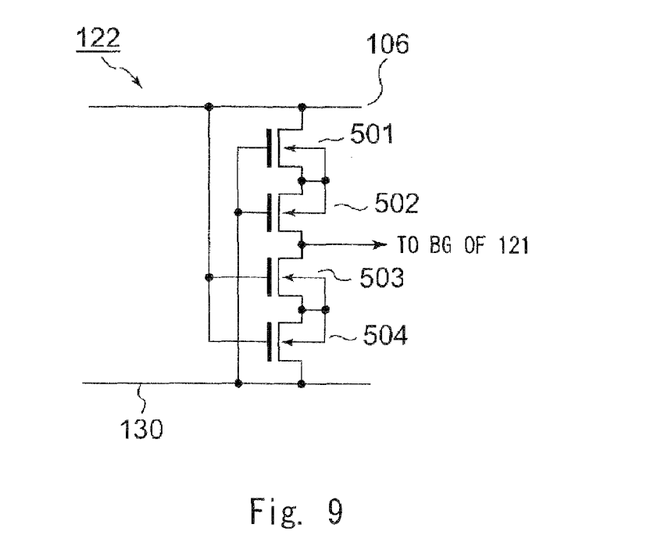
FIG. 9 is a circuit diagram showing a BG control circuit shown in FIG. 8.

Referring to FIG. 9, the BG control circuit 122 includes two N-channel MOS transistors 501 and 502, and two N-channel MOS transistors 503 and 504. The N-channel MOS transistors 501 and 502 are connected in series with each other between the output terminal 106 and the substrate terminal of the switch transistor 121. The two N-channel MOS transistors 503 and 504 are connected in series with each other between the substrate terminal of the switch transistor 121 and the reference voltage node 130.

The operations thereof are described below.

The operation for controlling the output transistor 109 in the conductive mode is carried out in the same manner as described above, so a description thereof is omitted. Note that, in the BG control circuit 122 (see FIG. 9) under the conductive mode, the reference voltage node 130 is set at a potential substantially equal to the ground potential and the output terminal 106 is set at a high potential. Thus, the transistors 501 and 502 are non-conductive, while the transistors 503 and 504 are conductive. As a result, the potential at the substrate terminal of the switch transistor 121 is set to the potential of the reference voltage node 130, thereby rendering the switch transistor 121 non-conductive. Also the switch transistor 114 is rendered non-conductive, and the parasitic diode 115 is reversely biased and blocked.

In the negative voltage surge mode, when the output transistor 109 is rendered non-conductive, the inductance component of the load 112 causes the negative voltage surge. When the negative voltage is generated, the voltage at the output terminal 106 drops.

In this case, since the gate charge discharging transistor 108 is rendered conductive, the gate voltage of the output transistor 109 is substantially equal to the voltage at the output terminal 106. Thereby the voltage at the gate of the output transistor 109 also drops due to the voltage drop of the output terminal 106.

When the voltage at the output terminal 106 becomes a negative voltage, the transistors 501 and 502 are turned on and the transistors 503 and 504 are turned off in the BG control circuit 122 (see FIG. 9). Thus, the potential at the substrate terminal of the switch transistor 121 is set to be substantially equal to the potential at the output terminal 106. The region of the switch transistor 121 disposed on the side of the output terminal 106 functions as a source, and the source voltage becomes lower than the gate voltage. Accordingly, the switch transistor 121 is rendered conductive to thereby electrically connect the output terminal 106 and the end of the resistor 118 disposed on the side of the transistor 114.

In this manner, the potential on the side of the source of the transistor 114 is substantially equal to the potential at the output terminal 106, as a result of the operation of the switch transistor 121. On the other hand, since the potential on the side of the drain of the transistor 114 is higher than the potential at the output terminal 106, the transistor 114 is non-conductive and the parasitic diode 115 is also non-conductive.

When a difference between the gate voltage (which is equal to the reference voltage 103 corresponding to the ground potential) of the switch transistor 110, and the potential at the gate of the output transistor 109 exceeds the threshold of the switch transistor 110, both the transistors 401 and 402 are rendered conductive. After that, when the gate voltage of the output transistor 109 drops and when a potential difference between both terminals of the dynamic clamp circuit 111 is equal to or larger than the breakdown voltage of the dynamic clamp circuit, a dynamic clamp voltage is generated at both terminals of the dynamic clamp circuit 111. Further, the output transistor 109 is rendered conductive. As a result, the voltage between the drain and the gate of the output transistor 109 is limited by the dynamic clamp voltage. Furthermore, the voltage between the drain and the source of the output transistor 109 is limited by a voltage value obtained by adding the dynamic clamp voltage and a threshold voltage of the output transistor 109.

In the examples shown in FIGS. 3 and 7, it is preferable to set the impedance of the gate charge discharging transistor 108 sufficiently smaller than that of the transistor 114 so that a sufficiently large negative voltage can be generated at the time of the negative voltage surge. According to the third exemplary embodiment of the present invention, however, it is not necessary to satisfy the condition.

The operation under the dump surge mode according to the third exemplary embodiment of the present invention is carried out in substantially the same manner as that described above. In this case, since the output transistor 109 is rendered non-conductive, the potentials at the gate and the source of the switch transistor 121 are equal to each other and the switch transistor 121 is rendered non-conductive. Further, the gate and the source of the switch transistor 114 are also connected to each other, so the switch transistor 114 is rendered non-conductive.

When the power supply is reversely connected, the non-conductivity of the switch transistor 110 is reliably secured as described above. Further, as a result of the operation of the reference voltage control circuit 131, the potential at the gate of the switch transistor 121 is set to be substantially equal to the potential of the power supply line 101 (−VB potential), and the potentials at the source and the drain thereof are set to be substantially equal to the potentials of the power supply lines 102 and 103 (ground potential), respectively. Thus, the switch transistor 121 is rendered non-conductive.

Meanwhile, an electrical path is formed between the gate of the output transistor 109 and the power supply line 103 through the transistor 114 and the parasitic diode 115, thereby rendering the output transistor 109 conductive. As a result, a current flows in a direction opposite to that at the time of a normal connection, that is, flows from the source to the drain of the output transistor 109.

The magnitude of the conductive current is substantially the same as that of a load current obtained during normal operations and an on-resistance of the output transistor 109 is substantially equal to that obtained at the time of normal operation. Accordingly, a calorific value of the output transistor 109 is equal to that obtained during the normal operation (when battery power supply VB is normally connected). Hence, even when the battery power supply VB is reversely connected, the output transistor 109 is prevented from being destroyed due to application of heat.

Thus, the power supply control circuit 500 performs the overvoltage protection function and the power supply reverse connection protection function with high reliability.

Referring to FIG. 8, elements other than the load 112 can be formed into an integrated circuit on a single semiconductor substrate. In this case, the semiconductor substrate itself may function as the drain region of the output transistor.

Figure 10:
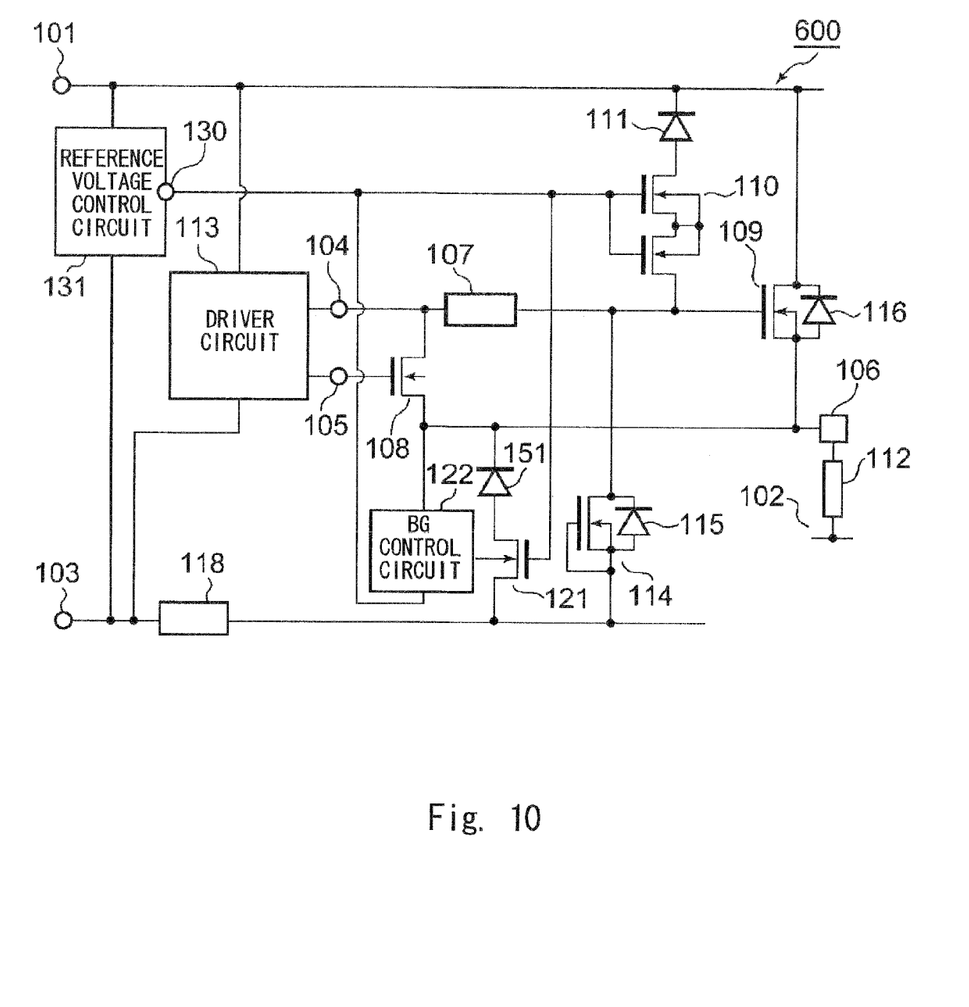
FIG. 10 is a circuit diagram showing a power supply control circuit according to a fourth exemplary embodiment of the present invention.

A still another exemplary embodiment of the present invention is shown in FIG. 10. Components identical with those shown in FIG. 8 are denoted by the same reference numerals, and a description thereof is omitted thereof.

A power supply control circuit 600 according to an exemplary embodiment of the present invention is greatly different from the circuit shown in FIG. 9 in that a diode 151 is additionally provided between the switch transistor 121 and the output terminal 106. The diode 151 has a function to enable the switch transistor 121 to be rendered non-conductive with higher reliability in a power supply reverse connection mode.

In this structure, when the power supply is reversely connected, that is, when the −VB potential is supplied to the power supply line 101 and the ground potential is supplied to the power supply line 103, the potential substantially equal to the potential of the power supply line 101, which is output to the reference voltage node 130, is applied to the gate of the switch transistor 121. Meanwhile, an electrical path is formed between the gate of the output transistor 109 and the power supply line 103 through the parasitic diode 115, thereby rendering the output transistor 109 conductive. As a result, the potential of the output terminal 106 is lowered to that of the power supply line 101, thereby a potential (effectively, voltage increased by an amount corresponding to a forward voltage drop of the diode 151 from the potential of the output terminal 106) is output to an anode of the diode 151. Consequently, the potential of the gate of the switch transistor 121 is rendered equal to or lower than that of the source (region connected to the anode of the diode 151) of the switch transistor 121, the switch transistor 121 is rendered non-conductive.

As described above, the power supply control circuit according to an exemplary embodiment of the present invention is capable of preventing the occurrence of a malfunction of a section for implementing the overvoltage protection function, which is caused due to the power supply reverse connection protection circuit, against the turn-off counter electromotive voltage (negative voltage surge). Further, when the power supply is reversely connected, a section for implementing the power supply reverse connection protection function is capable of performing a desired operation.

Note that the present invention is not limited to the above-mentioned exemplary embodiments. In particular, the number and the like of the transistors and diodes can be properly changed depending on a required circuit constant.

The first to fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A power supply control circuit, comprising:
a first and second power supply lines, a power supply voltage being applied between the first and second power supply lines;
an output transistor coupled between the first power supply line and an output terminal;
a first switch coupling the first power supply line with a control terminal of the output transistor when a counter electromotive voltage from a load, which is connected to the output terminal, is applied to the output terminal;
a switching element coupling the second power supply line with the control terminal of the output transistor when the power supply voltage is applied in a reverse direction between the first and second power supply lines; and
a reference voltage control circuit applying a potential corresponding to a potential of the second power supply line to a reference voltage node coupled to a control terminal of the first switch when the power supply voltage is applied in a forward direction between the first and second power supply lines, and that applies a potential corresponding to a potential of the first power supply line to the reference voltage node when the power supply voltage is applied in the reverse direction between the first and second power supply lines.

2. The power supply control circuit according to claim 1, wherein the first switch comprises first and second transistors connected in series with each other, a substrate terminal of the first transistor being connected in common with a substrate terminal of the second transistor.

3. The power supply control circuit according to claim 1, further comprising:

a resistor provided between the switching element and the second power supply line;
a second switch comprising a transistor coupled between a node electrically connected to the switching element and the resistor, and the output terminal; and
a substrate terminal control circuit applying one of a voltage at the reference voltage node and a voltage at the output terminal to the substrate terminal of the transistor included in the second switch.

4. The power supply control circuit according to claim 1, wherein the reference voltage control circuit comprises:
a diode coupled between the first power supply line and the reference voltage node; and
a resistor coupled between the reference voltage node and the second power supply line.

5. The power supply control circuit according to claim 1, wherein the reference voltage control circuit comprises:
third and fourth transistors connected in series with each other between the first power supply line and the reference voltage node, a gate of the third transistor and a gate of the fourth transistor being connected to the second power supply line; and
fifth and sixth transistors connected in series with each other between the reference voltage node and the second power supply line, a gate of the fifth transistor and a gate of the sixth transistor being connected to the first power supply line.

6. The power supply control circuit according to claim 3, wherein the substrate terminal control circuit comprises:
seventh and eighth transistors connected in series with each other between the substrate terminal of the transistor included in the second switch and the output terminal, a gate of the seventh transistor and a gate of the eighth transistor being connected to the reference voltage node; and
ninth and tenth transistors connected in series with each other between a substrate terminal of the transistor included in the second switch and the reference voltage node, a gate of the ninth transistor and a gate of the tenth transistor being connected to the output terminal.

7. A power supply control circuit, comprising:
an output transistor coupled between a first power supply line and an output terminal;
a load coupled to the output terminal;
a gate charge discharging switch coupled between a control terminal of the output transistor and the output terminal;
a power supply reverse connection protection circuit supplying an electric charge from a second power supply line to the control terminal of the output transistor when a power supply is reversely connected; and
an overvoltage protection circuit, the overvoltage protection circuit comprises:
a dynamic clamp circuit limiting a voltage difference between the first power supply line and the output terminal to a predetermined voltage value; and
a first switch coupled in series between the dynamic clamp circuit and the control terminal of the output transistor, and to be conductive or non-conductive state based on a result of comparison between a reference voltage and a voltage at the control terminal of the output transistor, the reference voltage being set to a voltage corresponding to a voltage of the second power supply line when a power supply is normally connected and being set to a voltage corresponding to a voltage of the first power supply line when the power supply is reversely connected.

8. The power supply control circuit according to claim 7, wherein the first switch comprises first and second transistors connected in series with each other, control terminals of the first transistor and the second transistor being connected in common with each other and substrate terminals of the first transistor and the second transistor being connected in common with each other.

9. The power supply control circuit according to claim 8, wherein the first and second transistors are formed in a second conductivity type semiconductor region formed in a first conductivity type semiconductor region.

10. The power supply control circuit according to claim 7, further comprising:
   a second switch including a transistor with one end coupled to the output terminal and another end coupled to the second power supply through a first resistor, the second switch being rendered conductive when a negative voltage is generated at the output terminal; and
   a substrate terminal control circuit switching a voltage at a substrate terminal of the transistor included in the second switch, between a voltage at the output terminal and the reference voltage, depending on a connection state of the power supply and a state of the output terminal.

11. The power supply control circuit according to claim 10, further comprising:
   a diode coupled between the transistor included in the second switch and the output terminal.

12. A power supply control circuit, comprising:
   first and second power supply lines, a power supply voltage being applied between the first power supply line and the second power supply line;
   an output transistor connected between the first power supply line and an output terminal;
   a first switch that electrically connects the first power supply line with a control terminal of the output transistor when a counter electromotive voltage from a load, which is connected to the output terminal, is applied to the output terminal;
   a switching element that electrically connects the second power supply line and the control terminal of the output transistor to each other when the power supply voltage is applied in a reverse direction between the first and second power supply lines; and
   a control circuit that applies a potential corresponding to a potential of the second power supply line to a control terminal of the first switch when the power supply voltage is applied in a forward direction between the first and second power supply lines, and that applies a potential corresponding to a potential of the first power supply line to the control terminal of the first switch when the power supply voltage is applied in the reverse direction between the first and second power supply lines.

13. The power supply control circuit according to claim 12, wherein the first switch comprises first and second transistors connected in series, a substrate terminal of the first transistor being connected in common with a substrate terminal of the second transistor.

14. The power supply control circuit according to claim 12, further comprising:
   a resistor provided between the switching element and the second power supply line;
   a second switch comprising a transistor provided between a node between the switching element and the resistor, and the output terminal; and
   a substrate terminal control circuit that applies one of a potential applied from the control circuit and a potential applied at the output terminal to a substrate terminal of the transistor included in the second switch.

15. The power supply control circuit according to claim 12, wherein the control circuit comprises:
   a diode coupled between the first power supply line and the control terminal of the first switch; and
   a resistor coupled between the control terminal of the first switch and the second power supply line.

16. The power supply control circuit according to claim 12, wherein the control circuit comprises:
   third and fourth transistors connected in series with each other between the first power supply line and the control terminal of the first switch, a gate of the third transistor and a gate of the fourth transistor being connected to the second power supply line; and
   fifth and sixth transistors connected in series with each other between the control terminal of the first switch and the second power supply line, a gate of the fifth transistor and a gate of the sixth transistor being connected to the first power supply line.

* * * * *